(12) United States Patent
Hung et al.

(10) Patent No.: US 10,032,747 B2
(45) Date of Patent: Jul. 24, 2018

(54) LIGHT EMITTING DIODE PACKAGE STRUCTURE AND MANUFACTURING METHOD THEREOF

(71) Applicant: Genesis Photonics Inc., Tainan (TW)

(72) Inventors: Chin-Hua Hung, Tainan (TW); Yu-Feng Lin, Tainan (TW)

(73) Assignee: GENESIS PHOTONICS INC., Tainan (TW)

( * ) Notice: Subject to any disclaimer, the term of this patent is extended or adjusted under 35 U.S.C. 154(b) by 0 days.

(21) Appl. No.: 15/073,710

(22) Filed: Mar. 18, 2016

(65) Prior Publication Data

US 2016/0276543 A1 Sep. 22, 2016

Related U.S. Application Data

(60) Provisional application No. 62/134,577, filed on Mar. 18, 2015.

(51) Int. Cl.
*H01L 25/065* (2006.01)
*H01L 33/60* (2010.01)
(Continued)

(52) U.S. Cl.
CPC ........ *H01L 25/0655* (2013.01); *H01L 23/562* (2013.01); *H01L 23/60* (2013.01); *H01L 25/0657* (2013.01); *H01L 25/0756* (2013.01); *H01L 27/0248* (2013.01); *H01L 27/15* (2013.01); *H01L 29/866* (2013.01); *H01L 33/08* (2013.01); *H01L 33/10* (2013.01); *H01L 33/48* (2013.01); *H01L 33/486* (2013.01); *H01L 33/50* (2013.01); *H01L 33/502* (2013.01); *H01L 33/52* (2013.01); *H01L 33/60* (2013.01); *H01L 33/642* (2013.01); *H01L 33/647* (2013.01);
(Continued)

(58) Field of Classification Search
CPC ............. H01L 25/0657; H01L 25/0756; H01L 25/117; H01L 25/167; H01L 27/0248; H01L 27/0255
See application file for complete search history.

(56) References Cited

U.S. PATENT DOCUMENTS 6,876,008 B2 * 4/2005 Bhat .................. H01L 33/62
257/84
8,044,412 B2 * 10/2011 Murphy .................. H01L 23/60
257/81

(Continued)

*Primary Examiner* — Phat X Cao
(74) *Attorney, Agent, or Firm* — McClure, Qualey & Rodack, LLP

(57) ABSTRACT

A light emitting diode package structure and a manufacturing method thereof are disclosed. The light emitting diode package structure includes a carrier substrate, a electrostatic protection component, and a light-emitting diode (LED). The carrier substrate has a first conductive pad and a second conductive pad. The electrostatic protection component is disposed on the carrier substrate and has a first electrode and a second electrode, wherein the first electrode and the second electrode are electrically connected to the first conductive pad and the second conductive pad respectively. The LED is disposed on the electrostatic protection component and has a third electrode and a fourth electrode, wherein the third electrode and the fourth electrode are electrically connected to the first conductive pad and the second conductive pad respectively.

16 Claims, 9 Drawing Sheets

(51) Int. Cl.
*H01L 33/08* (2010.01)
*H01L 33/52* (2010.01)
*H01L 27/02* (2006.01)
*H01L 23/00* (2006.01)
*H01L 33/10* (2010.01)
*H01L 33/50* (2010.01)
*H01L 23/60* (2006.01)
*H01L 29/866* (2006.01)
*H01L 33/48* (2010.01)
*H01L 27/15* (2006.01)
*H01L 33/64* (2010.01)
*H01L 25/075* (2006.01)
*H01L 33/56* (2010.01)

(52) U.S. Cl.
CPC ........ *H01L 25/0753* (2013.01); *H01L 33/508* (2013.01); *H01L 33/56* (2013.01); *H01L 2224/16225* (2013.01); *H01L 2224/48091* (2013.01); *H01L 2224/49107* (2013.01); *H01L 2924/18161* (2013.01); *H01L 2933/0025* (2013.01); *H01L 2933/0033* (2013.01); *H01L 2933/0041* (2013.01); *H01L 2933/0058* (2013.01)

(56) References Cited

U.S. PATENT DOCUMENTS

2006/0057751 A1* 3/2006 Shen ............... H01L 25/167
438/22
2011/0291143 A1* 12/2011 Kim ............... H01L 33/56
257/98

* cited by examiner

LIGHT EMITTING DIODE PACKAGE STRUCTURE AND MANUFACTURING METHOD THEREOF

This application claims the benefit of U.S. provisional application Ser. No. 62/134,577, filed Mar. 18, 2015, the subject matter of which is incorporated herein by reference.

TECHNICAL FIELD

The disclosure relates to a light emitting diode package structure and a manufacturing method thereof, and also relates to a light emitting diode package structure having an electrostatic protection component and a manufacturing method thereof.

BACKGROUND

The light-emitting diode (LED) has advantages, such as long life, small size, high shock resistance, low heat generation and low power consumption, etc., and thus along with the development of technology, the LED has been widely used in household equipment and a variety of indicators or light sources. Although the LED has these advantages as mentioned above, the LED is easy to be damaged by abnormal voltage or electrostatic discharge.

In order to avoid LED being damaged due to abnormal voltage or electrostatic discharge, the LED and an electrostatic protection component, such as Zener diode, are disposed on the same carrier substrate, and the LED and Zener diode are reversely connected through the electrodes for preventing the LED from being damaged due to abnormal voltage or electrostatic discharge. However, since the LED and the electrostatic protection component both are disposed on the same plane of the carrier substrate in which the electrostatic protection component may block and absorb the light emitted from the LED, it leads to reduce the emitting efficiency of the LED and also render the size of the LED package structure becoming larger and thus the LED becomes restricted in application.

Thus, it is necessary to provide a light emitting diode package structure and a manufacturing method thereof to resolve the problem of the prior art.

SUMMARY

According to one embodiment, a light emitting diode package structure is provided. The light emitting diode package structure includes a carrier substrate, a protecting component and an LED. The carrier substrate has a first conductive pad and a second conductive pad. The protecting component is disposed on the carrier substrate and has a first electrode and a second electrode, wherein the first electrode and the second electrode are electrically connected to the first conductive pad and the second conductive pad respectively. The LED is disposed above the electrostatic protection component and has a third electrode and a fourth electrode, wherein the third electrode and the fourth electrode are electrically connected to the first conductive pad and the second conductive pad, respectively.

According to another embodiment, a manufacturing method of a light emitting diode package structure is provided. The manufacturing method includes the following steps. A carrier substrate having a first conductive pad and a second conductive pad is provided; an electrostatic protection component is disposed on the carrier substrate, wherein the electrostatic protection component has a first electrode and a second electrode; the first electrode and the second electrode is electrically connected to the first conductive pad and the second conductive pad respectively; a LED is disposed above the carrier substrate, wherein the LED has a third electrode and a fourth electrode; and the third electrode and the fourth electrode are electrically connected to the first conductive pad and the second conductive pad respectively.

Figure 1A:
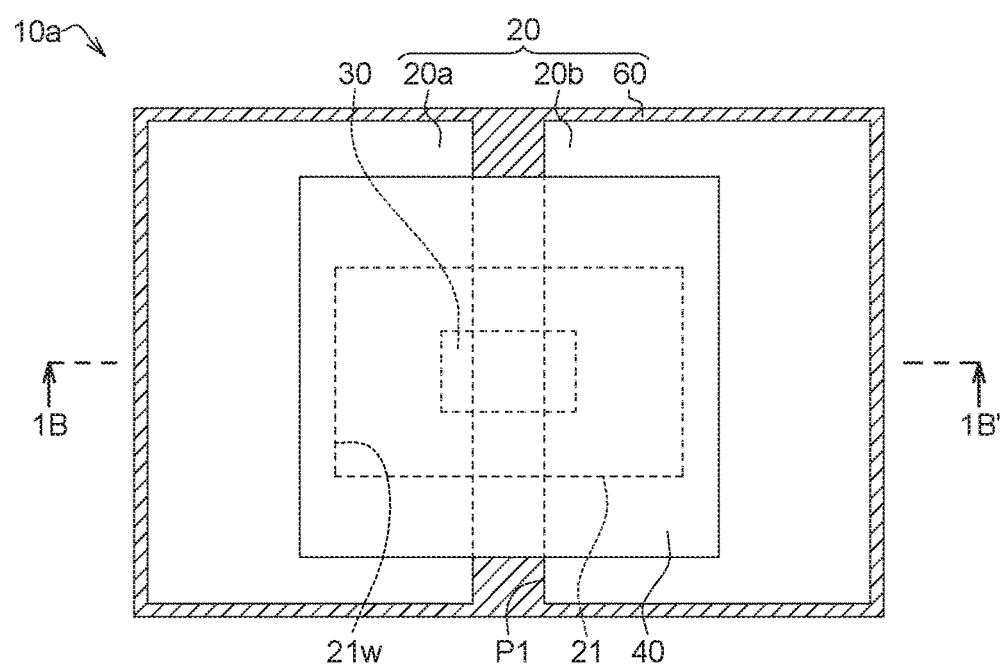
FIG. 1A illustrates a top view of a light emitting diode package structure according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
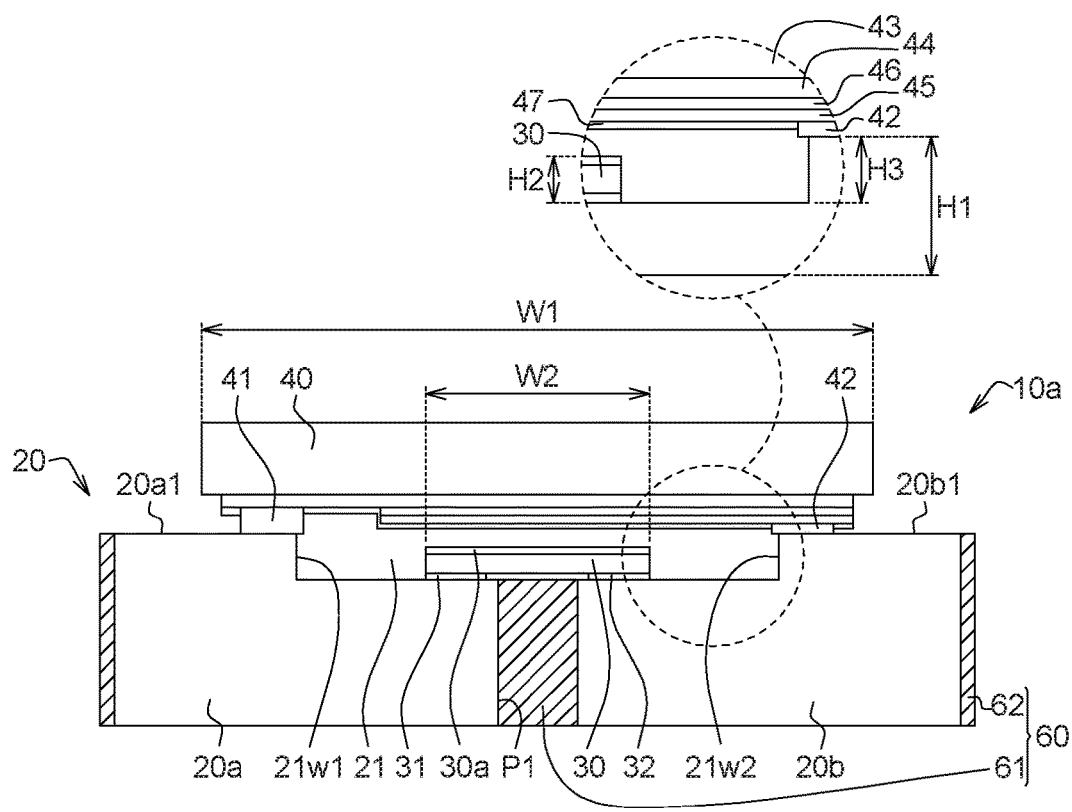
FIG. 1B illustrates a cross sectional view of the light emitting diode package structure of FIG. 1A along a direction 1B-1B'.

FIG. 1A illustrates a top view of a light emitting diode package structure 10a according to an embodiment of the disclosure, and FIG. 1B illustrates a cross sectional view of the light emitting diode package structure 10a of FIG. 1A along a direction 1B-1B'.

The light emitting diode package structure 10a includes a carrier substrate 20, an electrostatic protection component 30 and a LED 40.

The carrier substrate 20 is used for carrying the electrostatic protection component 30 and the LED 40. The carrier substrate 20 includes a first conductive pad 20a, a second conductive pad 20b and an insulation body 60. The first conductive pad 20a and the second conductive pad 20b are electrically isolated by the insulation body 60. For example, there is a gap P1 formed between the first conductive pad 20a and the second conductive pad 20b, and the insulation body 60 includes a spacer 61 and a periphery portion 62, wherein at least a portion of the gap P1 is filled with the spacer 61 to separate the first conductive pad 20a and the second conductive pad 20b. In addition, the periphery portion 62 encapsulates a lateral surface of the first conductive pad 20a and a lateral surface of the second conductive pad 20b to prevent the lateral surface of the first conductive pad 20a and the lateral surface of the second conductive pad 20b from being exposed, and accordingly it can prevent the first conductive pad 20a and the second conductive pad 20b from being electrically short to each other through the exposed lateral surfaces.

In an embodiment, the first conductive pad 20a and the second conductive pad 20b may be made of metal, such as copper, aluminum and alloy thereof; however, such exemplification is not meant to be for limiting. In an embodiment, the insulation body 60 may be made of silicone, epoxy, or polyphthalamide polyamide resin (PPA); however, such exemplification is not meant to be for limiting.

The electrostatic protection component 30 is disposed on the carrier substrate 20. The electrostatic protection component 30 is an electronic component, for example, Zener diode capable of preventing abnormal voltage or electrostatic discharge; however, such exemplification is not meant to be for limiting. The electrostatic protection component 30 has a first electrode 31 and a second electrode 32, wherein the first electrode 31 is electrically connected to the first conductive pad 20a, and the second electrode 32 is electrically connected to the second conductive pad 20b. Although not illustrated, a solder may be formed between the first electrode 31 and the first conductive pad 20a, and another solder may be formed between the second electrode 32 and the second conductive pad 20b, wherein the solder may weld the electrode and the conductive pad.

The carrier substrate 20 has a recess 21, and the recess 21 extends downwardly from a first upper surface 20a1 of the first conductive pad 20a and a second upper surface 20b1 of the second conductive pad 20b, but not passes through the first conductive pad 20a and the second conductive pad 20b. The recess 21 may be formed by way of half-etching technique or machining technique; however, such exemplification is not meant to be for limiting.

The electrostatic protection component 30 is disposed within the recess 21. As a result, the electrostatic protection component 30 does not interfere with the above LED 40 and the space of the carrier substrate 20 along a thickness direction may be adequately used.

At least one electrode of the electrostatic protection component 30 may be disposed between a third electrode 41 and a fourth electrode 42 of the LED 40. For example, as shown in FIG. 1B, the first electrode 31 and the second electrode 32 of the electrostatic protection component 30 are located between the third electrode 41 and the fourth electrode 42.

In addition, the carrier substrate 20 has a sidewall within which the electrostatic protection component 30 is located. For example, as shown in FIG. 1A, the electrostatic protection component 30 is surrounded by an inner sidewall 21w. As shown in FIG. 1B, the recess 21 has two opposite inner sidewalls 21w1 and 21w2, and the electrostatic protection component 30 is located between the inner sidewall 21w1 and the inner sidewall 21w2.

The LED 40 may emit light. The LED 40 is disposed on the carrier substrate 20. For example, the LED 40 has the third electrode 41 and the fourth electrode 42, wherein the third electrode 41 is electrically connected to the first conductive pad 20a, and the fourth electrode 42 is electrically connected to the second conductive pad 20b. As a result, the first electrode 31 of the electrostatic protection component 30 and the third electrode 41 of the LED 40 are co-point, and the second electrode 32 of the electrostatic protection component 30 and the fourth electrode 42 of the LED 40 are co-point, and accordingly the electrostatic protection component 30 is connected to the LED 40 in parallel. As a result, the electrostatic protection component 30 may prevent the LED 40 from being damaged by abnormal voltage or electrostatic discharge.

In addition, the LED 40 and the carrier substrate 20 may be connected by way of eutectic bonding method; however, such exemplification is not meant to be for limiting. Although not illustrated, a solder may be formed between the third electrode 41 and the first conductive pad 20a, and another solder may be formed between the fourth electrode 42 and the second conductive pad 20b, wherein the solder may weld the electrode and the conductive pad.

As shown in FIG. 1B, the LED 40 may be directly disposed right above the electrostatic protection component 30. By the LED 40 and the electrostatic protection component 30 being disposed in a vertical orientation, it can prevent the electrostatic protection component 30 from occupying a horizontal area of the carrier substrate 20 and can reduce a surface area of the light emitting diode package structure 10a.

The LED 40 has a surface area larger than that of the recess 21. For example, as shown in FIG. 1B, the volume of the LED 40 is larger than the volume of the recess 21, and thus the surface area of the LED 40 is larger than that of the recess 21.

As shown in FIG. 1B, the LED 40 has a first width W1, and the electrostatic protection component 30 has a second width W2, wherein the first width W1 is larger than the second width W2, such that the LED 40 may cover the entire electrostatic protection component 30. In an embodiment, the first width W1 may be three times as wide as the second width W2. In another embodiment, the first width W1 may be more or less than three times as wide as the second width W2. In addition, the carrier substrate 20 has a first thickness H1, the electrostatic protection component 30 has a second thickness H2, and the recess 21 has a depth H3. In an embodiment, the first thickness H1 ranges, for example, between 0.38 millimeters and 0.5 millimeters, the second thickness H2 may be, for example, 0.1 millimeters, and the depth H3 may satisfy the following formulas (1) and (2), wherein value A ranges, for example, between 0.05 millimeters and 0.1 millimeters.

$$H3 < 0.5 \times H1 \tag{1}$$

$$H3 = H2 + A \tag{2}$$

Due to the design of first thickness H1, the second thickness H2 and the depth H3, when the LED 40 is disposed above the electrostatic protection component 30, the electrostatic protection component 30 is almost invisible from the appearance of the light emitting diode package structure 10a, and/or the depth of the recess 21 does not affect the original working of the carrier substrate 20.

As shown in FIG. 1B, the LED 40 is, for example, flip-chip LED; however, such exemplification is not meant to be for limiting. The LED 40 further includes a substrate 43, a first-type semiconductor layer 44, a second-type semiconductor layer 45, a light-emitting layer 46 and a second reflective layer 47. The first-type semiconductor layer 44 is formed on the substrate 43, the light-emitting layer 46 is, for example, Multiple Quantum Well (MQW) and is formed between the first-type semiconductor layer 44 and the second-type semiconductor layer 45. The first-type semiconductor layer 44 is one of p-type semiconductor and n-type semiconductor, and the second-type semiconductor layer 45 is another of p-type semiconductor and n-type semiconductor.

In the present embodiment, the second reflective layer 47 is formed as Distributed Bragg reflector (DBR) structure. The second reflective layer 47 may be formed on a bottom layer of the LED 40, for example, underneath the second-type semiconductor layer 45. As a result, the light which is incident to the second reflective layer 47 may be reflected to be emitted out of the substrate 43, and accordingly it can prevent from leak of light toward the carrier substrate 20.

As shown in FIG. 1B, a first reflective layer 30a may be formed on a top portion of the electrostatic protection component 30 for increasing the light reflection effect. In addition, the second reflective layer 47 and/or the first reflective layer 30a may be formed by way of evaporation. In an embodiment, the second reflective layer 47 and/or the first reflective layer 30a may be made of metal. In another embodiment, the LED 40 may omit at least one of the second reflective layer 47 and the first reflective layer 30a.

As shown in FIG. 1B, the second reflective layer 47 has two openings (not designated) exposing the first-type semiconductor layer 44 and the second-type semiconductor layer 45. The third electrode 41 and the fourth electrode 42 may be electrically connected to the first-type semiconductor layer 44 and the second-type semiconductor layer 45 respectively through the openings.

As shown in FIG. 1B, there is no adhesive formed within the recess 21. Alternatively, there is no physical component formed within the recess 21 except for the electrostatic protection component 30; however, such exemplification is not meant to be for limiting.

Figure 2:
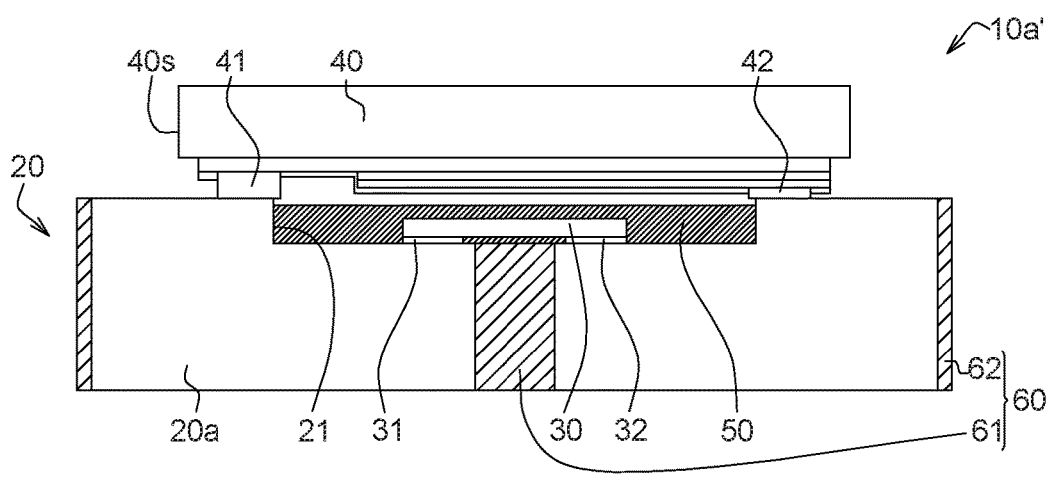
FIG. 2 illustrates a cross sectional view of a light emitting diode package structure according to another embodiment of the disclosure.

FIG. 2 illustrates a cross sectional view of a light emitting diode package structure 10a' according to another embodiment of the disclosure. The light emitting diode package structure 10a' includes the carrier substrate 20, the electrostatic protection component 30, the LED 40 and a highly reflective adhesive 50. The light emitting diode package structure 10a' is different from the light emitting diode package structure 10a in that the light emitting diode package structure 10a' further includes the highly reflective adhesive 50.

The highly reflective adhesive 50 may be formed within at least a portion of the recess 21 for securing a relative position between the electrostatic protection component 30 and the carrier substrate 20. The highly reflective adhesive 50 may be made of silicone or epoxy and has a reflectivity higher than 90%; however, such exemplification is not meant to be for limiting. As shown in FIG. 2, the highly reflective adhesive 50 may encapsulate the whole top surface and the whole lateral surface of the electrostatic protection component 30. In another embodiment, the highly reflective adhesive 50 may encapsulate a portion of the top surface of the electrostatic protection component 30 and/or a portion of the lateral surface of the electrostatic protection component 30. In the present embodiment, the highly reflective adhesive 50 does not contact with a bottom surface of the LED 40. In another embodiment, the highly reflective adhesive 50 may contact with the bottom surface of the LED 40, such as electrode and/or the second reflective layer 47.

As shown in FIG. 2, due to the design of the highly reflective adhesive 50, the electrostatic protection component 30 may omit the first reflective layer 30a or includes the first reflective layer 30a.

Figure 3:
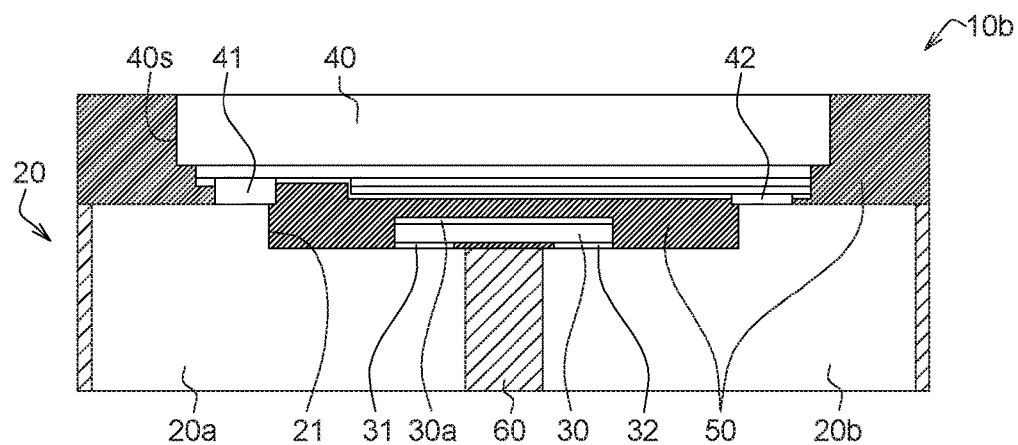
FIG. 3 illustrates a cross sectional view of a light emitting diode package structure according to another embodiment of the disclosure.

FIG. 3 illustrates a cross sectional view of a light emitting diode package structure 10b according to another embodiment of the disclosure. The light emitting diode package structure 10b includes the carrier substrate 20, the electrostatic protection component 30, the LED 40 and the highly reflective adhesive 50.

The light emitting diode package structure 10b is different from the light emitting diode package structure 10a' in that the highly reflective adhesive 50 of the light emitting diode package structure 10b further cover a periphery of the LED of LED 40, for example, the lateral surface 40s of the LED 40. As a result, when the light emitted from the lateral surface 40s of the LED 40 is incident to the highly reflective adhesive 50, the light may be reflected to be emitted out of an upper surface of the LED 40, and accordingly the illumination of the LED 40 can be concentrated, but not be scattered from the peripheral of the LED 40.

Figure 4:
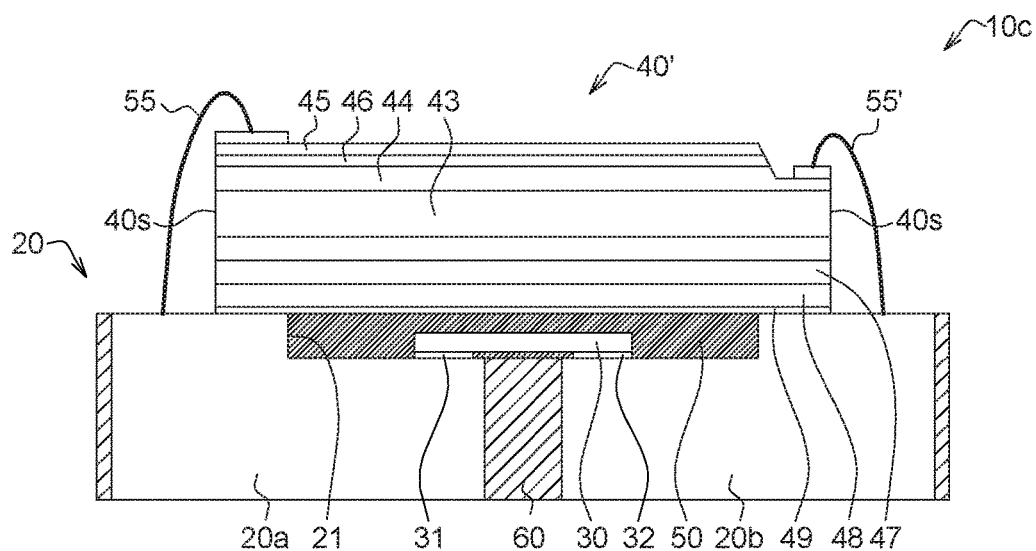
FIG. 4 illustrates a cross sectional view of a light emitting diode package structure according to another embodiment of the disclosure.

FIG. 4 illustrates a cross sectional view of a light emitting diode package structure 10c according to another embodiment of the disclosure. The light emitting diode package structure 10c includes the carrier substrate 20, the electrostatic protection component 30, an LED 40', the highly reflective adhesive 50 and a plurality of solder wires 55 and 55'.

The LED 40' is different from the LED 40 in that the LED 40' is a lateral chip structure LED.

For example, the LED 40' includes the substrate 43, the first-type semiconductor layer 44, the second-type semiconductor layer 45, the light-emitting layer 46, the second reflective layer 47, a third reflective layer 48 and an insulation layer 49. The first-type semiconductor layer 44 is formed on the substrate 43, and the light-emitting layer 46 is formed between the first-type semiconductor layer 44 and the second-type semiconductor layer 45. The second reflective layer 47 is formed under the light-emitting layer 46, and accordingly the light incident to the second reflective layer 47 may be reflected to be emitted out of the upper surface of the LED 40', and it can prevent from the leak of light toward the carrier substrate 20. The insulation layer 49 is formed on the third reflective layer 48, for example, underneath the third reflective layer 48, for separating the third reflective layer 48 and the carrier substrate 20, and accordingly it can prevent the third reflective layer 48 from being electrically short to the carrier substrate 20.

In addition, the second reflective layer 47 and/or the third reflective layer 48 may be formed by way of evaporation. In an embodiment, the second reflective layer 47 and/or the third reflective layer 48 may be made of metal. In another embodiment, the LED 40' may omit at least one of the second reflective layer 47 and the third reflective layer 48.

The second reflective layer 47 and the third reflective layer 48 may form as Omni-Directional reflector (ODR) structure. In another embodiment, the third reflective layer 48 may be omitted, such that the second reflective layer 47 forms as DBR structure.

As shown in FIG. 4, a solder wire 55 may connect the first conductive pad 20a and the second-type semiconductor layer 45, and another solder wire 55' may connect the second conductive pad 20b and the first-type semiconductor layer 44, such that the carrier substrate 20 and the LED 40' may be electrically connected through the solder wires 55 and 55'.

In another embodiment, the highly reflective adhesive 50 of the light emitting diode package structure 10c in FIG. 4 may further encapsulate the solder wires 55, 55' and the lateral surface 40s of the Led 40', but not encapsulate a light-emitting upper surface of the LED 40'. In other embodiment, the light emitting diode package structure 10c may omit the highly reflective adhesive 50.

Figure 5:
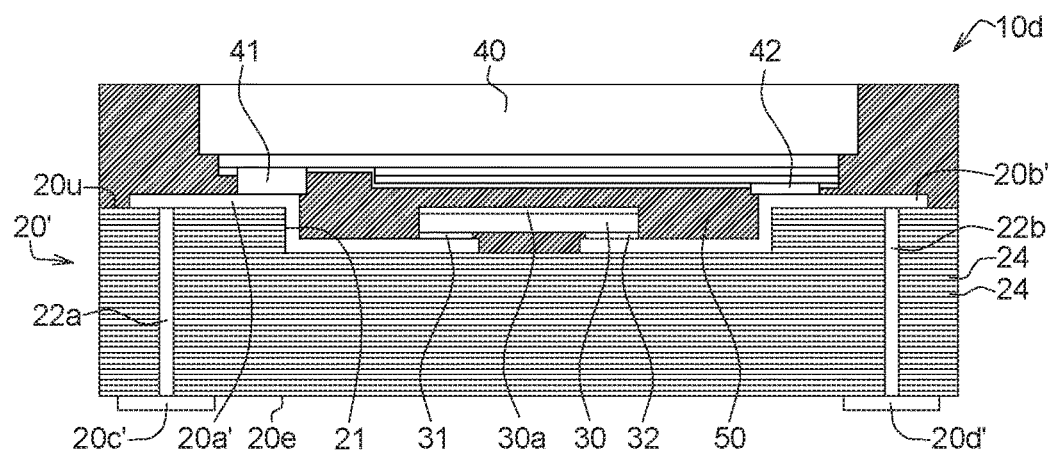
FIG. 5 illustrates a cross sectional view of a light emitting diode package structure according to another embodiment of the disclosure.

FIG. 5 illustrates a cross sectional view of a light emitting diode package structure 10d according to another embodiment of the disclosure. The light emitting diode package structure 10d includes a carrier substrate 20', the electrostatic protection component 30, the LED 40 and the highly reflective adhesive 50.

The carrier substrate 20' is different from the carrier substrate 20 in that the carrier substrate 20' is a ceramic substrate. The ceramic substrate 20' includes a plurality of ceramic plates 24 which are stacked to each other, a first conductive pad 20a', a second conductive pad 20b', a first conductive via 22a, a second conductive via 22b, a third conductive pad 20c', a fourth conductive pad 20d' and the recess 21.

The recess 21 extends from an upper surface 20u (for example, a top surface of the uppermost ceramic plate 24) of the carrier substrate 20' toward a lower surface 20e of the carrier substrate 20', but not passes through the thickness of the stacked ceramic plates 24. The first conductive pad 20a' and the second conductive pad 20b' extend to the recess 21 from the upper surface 20u, and the first conductive pad 20a' and the second conductive pad 20b' are separated from each other. The third conductive pad 20c' and the fourth conductive pad 20d' are formed on the lower surface 20e of the carrier substrate 20', and the third conductive pad 20c' and the fourth conductive pad 20d' are separated from each other. The first conductive via 22a and the second conductive via 22b pass through the stacked ceramic plates 24, wherein the first conductive via 22a connects the first conductive pad 20a' and the third conductive pad 20c', and the second conductive via 22b connects the second conductive pad 20b' and the fourth conductive pad 20d'.

The electrostatic protection component 30 is disposed within the recess 21. The electrostatic protection component 30 includes the first electrode 31 and the second electrode 32, wherein the first electrode 31 is electrically connected to the first conductive pad 20a', and the second electrode 32 is electrically connected to the second conductive pad 20b'. Although not illustrated, a solder may be formed between the first electrode 31 and the first conductive pad 20a', and another solder may be formed between the second electrode 32 and the second conductive pad 20b', wherein the solder may weld the electrode and the conductive pad.

The LED 40 may be disposed on the upper surface 20u of the carrier substrate 20'. The third electrode 41 of the LED 40 is electrically connected to the first conductive pad 20a', and the fourth electrode 42 of the LED 40 is electrically connected to the second conductive pad 20b'. Although not illustrated, a solder may be formed between the third electrode 41 and the first conductive pad 20a', and another solder may be formed between the fourth electrode 42 and the second conductive pad 20b', wherein the solder may weld the electrode and the conductive pad.

Due to the first electrode 31 of the electrostatic protection component 30 and the third electrode 41 of the LED 40 being co-point, and the second electrode 32 of the electrostatic protection component 30 and the fourth electrode 42 of the LED 40 being co-point, the electrostatic protection component 30 is connected to the LED 40 in parallel. As a result, the electrostatic protection component 30 may prevent the LED 40 from being damaged by abnormal voltage or electrostatic discharge.

In an embodiment, at least one of the first conductive pad 20a', the second conductive pad 20b', the third conductive pad 20c' and the fourth conductive pad 20d' may be formed by way of electroplate technique in the same manufacturing process; however, such exemplification is not meant to be for limiting. In an embodiment, the first conductive via 22a and the second conductive via 22b may be formed by way of drilling technique and electroplate technique. In terms of material, the first conductive pad 20a', the second conductive pad 20b', the third conductive pad 20c' and the fourth conductive pad 20d' may be made of silver or alloy thereof, and the first conductive via 22a and the second conductive via 22b may be made of copper or alloy thereof.

In another embodiment, the light emitting diode package structure 10d may omit the highly reflective adhesive 50. Alternatively, the highly reflective adhesive 50 of the light emitting diode package structure 10d may only encapsulate at least a portion of the electrostatic protection component 30, but not encapsulates the LED 40.

FIGS. 6A to 6F illustrate manufacturing processes of the light emitting diode package structure 10a of FIG. 1B and the light emitting diode package structure 10b of FIG. 3.

Firstly, the carrier substrate 20 is provided. The forming method of the carrier substrate 20 will be described below.

Figure 6A:
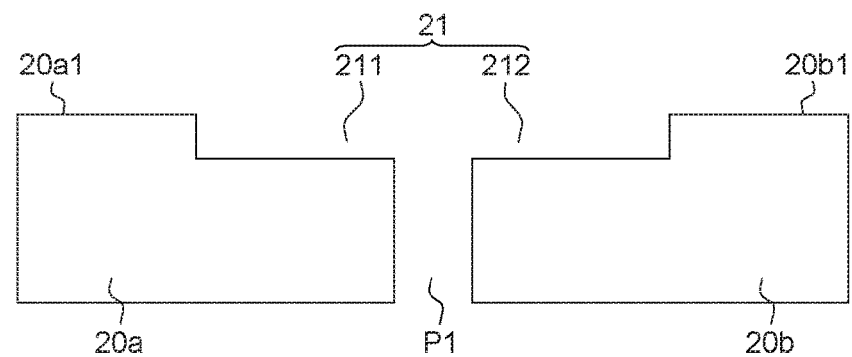
FIGS. 6A to 6F illustrate manufacturing processes of the light emitting diode package structure of FIG. 1B and the light emitting diode package structure of FIG. 3.

As shown in FIG. 6A, the first conductive pad 20a and the second conductive pad 20b are provided. There is the gap P1 formed between the first conductive pad 20a and the second conductive pad 20b, such that the first conductive pad 20a and the second conductive pad 20b are electrically separated from each other through the gap P1. The first conductive pad 20a has a first-sub recess 211, and the second conductive pad 20b has a second-sub recess 212, wherein the first-sub recess 211 and the second-sub recess 212 form the recess 21. The first-sub recess 211, the second-sub recess 212 and the gap P1 may be formed in the same manufacturing process. In another embodiment, the first-sub recess 211, the second-sub recess 212 and the gap P1 may be respectively formed in different manufacturing processes. In addition, the first-sub recess 211, the second-sub recess 212 and/or the gap P1 may be formed by way of half-etching technique or machining technique.

Figure 6B:
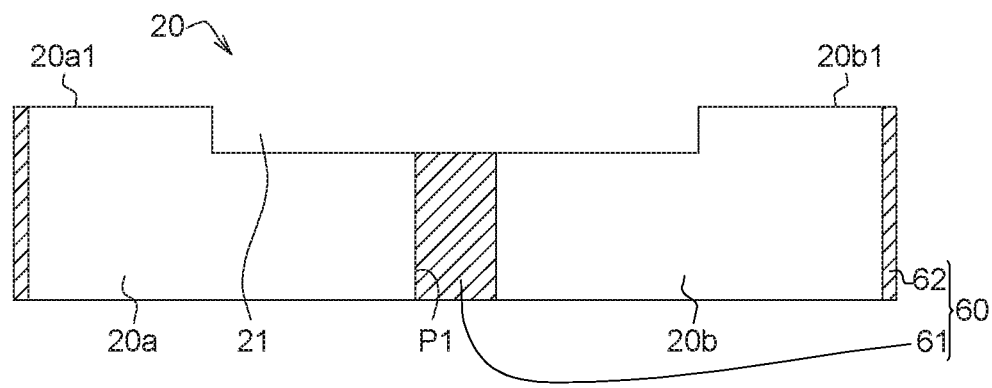

As shown in FIG. 6B, the insulation body 60 may be formed by way of, for example, packaging technique or dispensing technique to form the carrier substrate 20, wherein the insulation body 60 may be formed within at least a portion of the gap P1 and may encapsulate the lateral surface of the first conductive pad 20a and the lateral surface of the second conductive pad 20b.

Figure 6C:
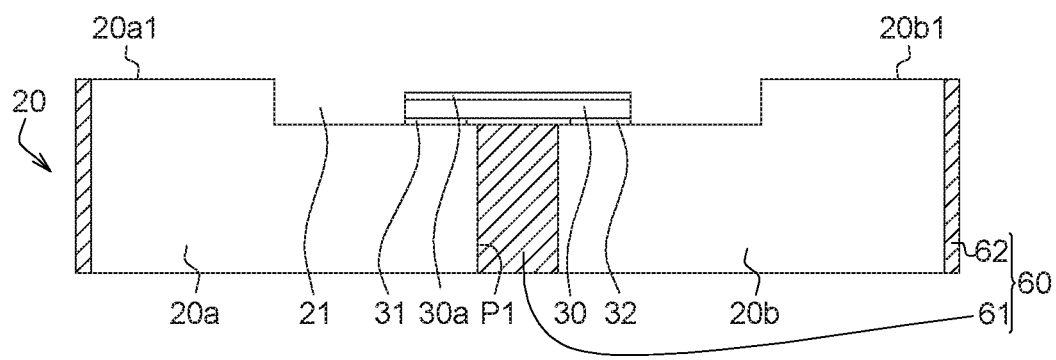

As shown in FIG. 6C, the electrostatic protection component 30 is disposed within the recess 21 by way of, for example, surface mounting technique (SMT) or eutectic bonding technique. The electrostatic protection component 30 includes the first electrode 31 and the second electrode 32, wherein the first electrode 31 and the second electrode 32 are electrically connected the first conductive pad 20a and the second conductive pad 20b respectively.

Figure 6D:
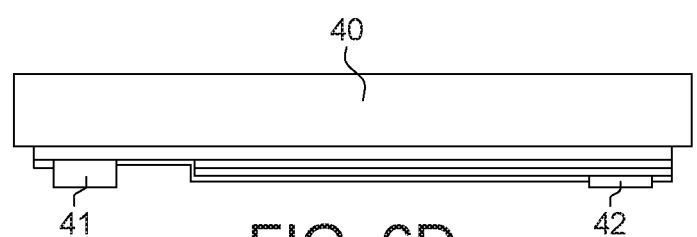

As shown in FIG. 6D, the LED 40 is provided. The LED 40 at least includes the third electrode 41 and the fourth electrode 42.

Figure 6E:
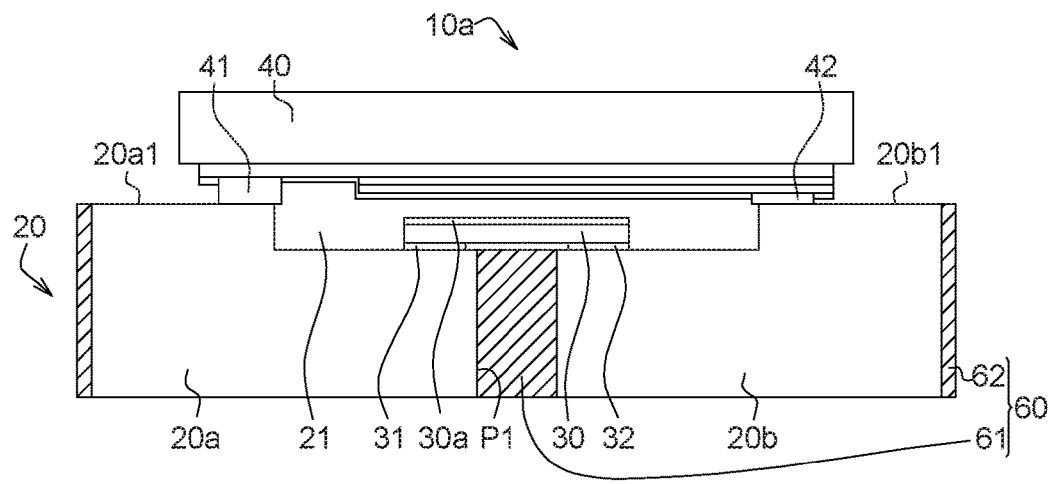

As shown in FIG. 6E, the LED 40 is disposed on the carrier substrate 20 by way of, for example, surface mounting technique or eutectic bonding technique to form the light emitting diode package structure 10a, wherein the third electrode 41 and the fourth electrode 42 of the LED 40 are electrically connected the first conductive pad 20a and the second conductive pad 20b respectively.

As shown in FIG. 6E, the first electrode 31 of the electrostatic protection component 30 and the third electrode 41 of the LED 40 are co-point, and the second electrode 32 of the electrostatic protection component 30 and the fourth electrode 42 of the LED 40 are co-point, and accordingly the electrostatic protection component 30 is connected to the LED 40 in parallel. As a result, the electrostatic protection component 30 may prevent the LED 40 from being damaged by abnormal voltage or electrostatic discharge.

Figure 6F:
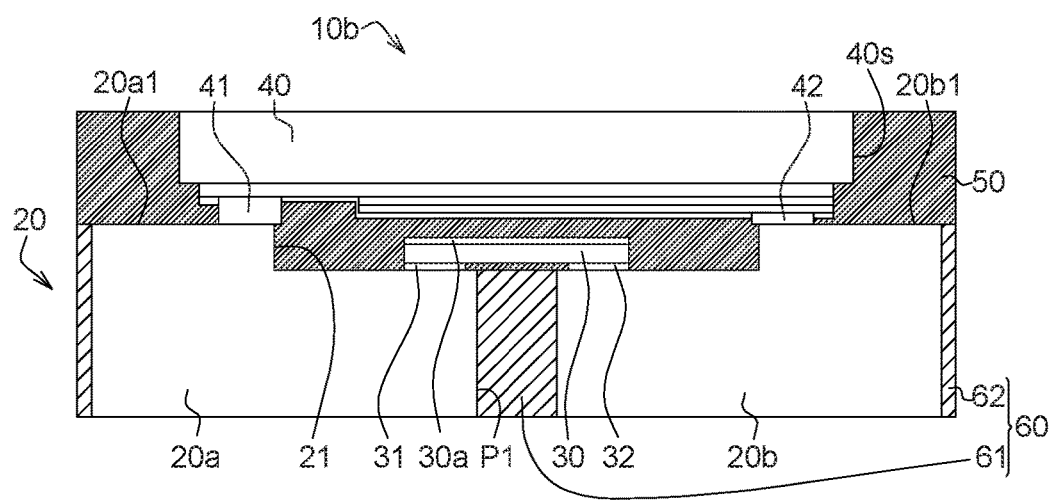

As shown in FIG. 6F, the highly reflective adhesive 50 is formed by way of, for example, packaging technique or dispensing technique to form the light emitting diode package structure 10b, wherein the recess 21 is filled with the highly reflective adhesive 50 and the highly reflective adhesive 50 covers the lateral surface 40s of the LED 40.

In another embodiment, the highly reflective adhesive 50 of FIG. 6F may only cover at least a portion of the electrostatic protection component 30, but not cover the lateral surface 40s of the LED 40. As a result, the light emitting diode package structure 10a' of FIG. 2 may be formed.

The manufacturing processes of the light emitting diode package structure 10c of FIG. 4 may be similar to that of the light emitting diode package structure 10c, and the difference is in that the wire bonding of the solder wires 55 and 55' is added to the manufacturing processes of the light emitting diode package structure 10c.

Figure 7A:
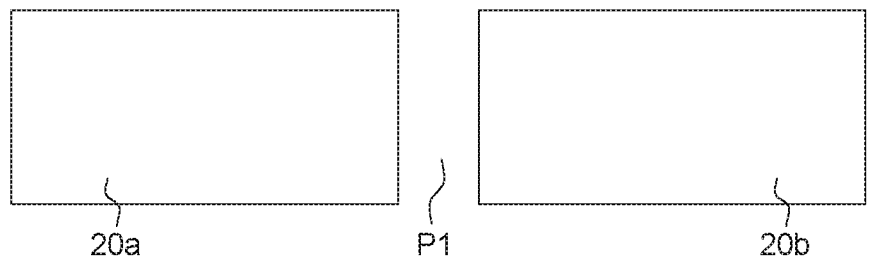
FIGS. 7A to 7C illustrate another manufacturing processes of the carrier substrate of FIGS. 1B, 2, 3 and 4.
Figure 7B:
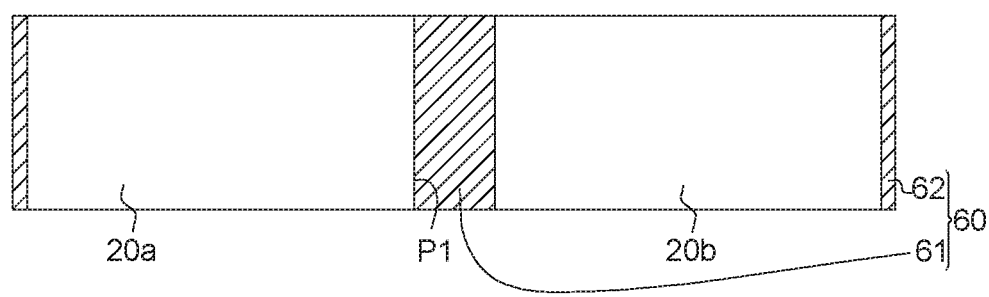
Figure 7C:
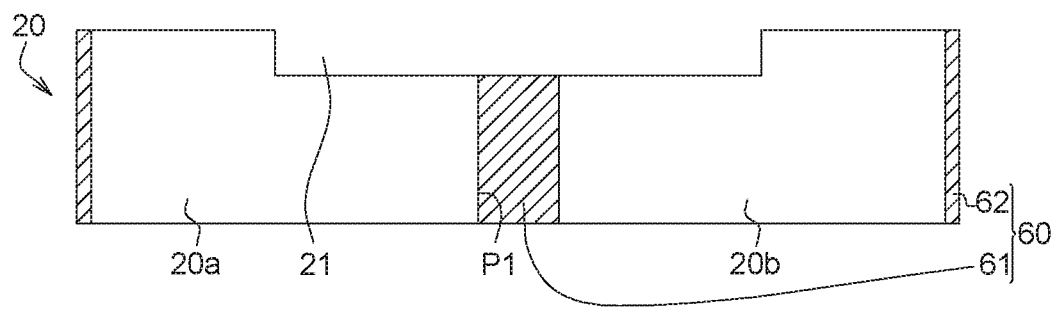

FIGS. 7A to 7C illustrate another manufacturing processes of the carrier substrate 20 of FIGS. 1B, 2, 3 and 4.

As shown in FIG. 7A, the first conductive pad 20a and the second conductive pad 20b are provided, wherein there is the gap P1 formed between the first conductive pad 20a and the second conductive pad 20b, such that the first conductive pad 20a and the second conductive pad 20b are electrically separated through the gap P1. Compared with the conductive pads of FIG. 6A, in this step, the first-sub recess 211 has not be formed on the first conductive pad 20a and the second-sub recess 212 has not be formed on the second conductive pad 20b yet.

As shown in FIG. 7B, the insulation body 60 may be formed by way of, for example, packaging technique or dispensing technique, wherein the insulation body 60 may be formed within at least a portion of the gap P1 and may encapsulate the lateral surface of the first conductive pad 20a and the lateral surface of the second conductive pad 20b.

As shown in FIG. 7C, the recess 21 may be formed by removing a portion of the first conductive pad 20a, a portion of the second conductive pad 20b and a portion of the insulation body 60 of FIG. 7B to form the carrier substrate 20 using way of, for example half-etching technique or machining technique.

FIGS. 8A to 8F illustrate manufacturing processes of the light emitting diode package structure 10d of FIG. 5.

Figure 8A:
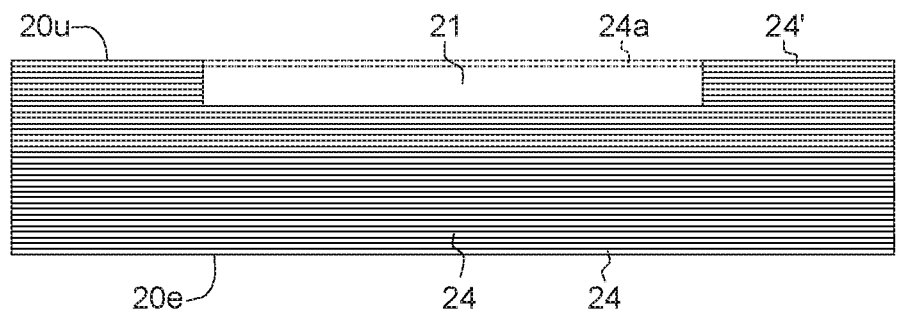
FIGS. 8A to 8F illustrate manufacturing processes of the light emitting diode package structure of FIG. 5.

As shown in FIG. 8A, several ceramic plates 24 are stacked to form a stacked ceramic substrate. The recess 21 is formed on the ceramic plates 24, wherein the recess 21 extends toward the lower surface 20e from the upper surface 20u, but not passes through the stacked ceramic substrate. For example, each of some ceramic plates 24' has an opening 24a, and the recess 21 is formed after the ceramic plates 24' are stacked.

Figure 8B:
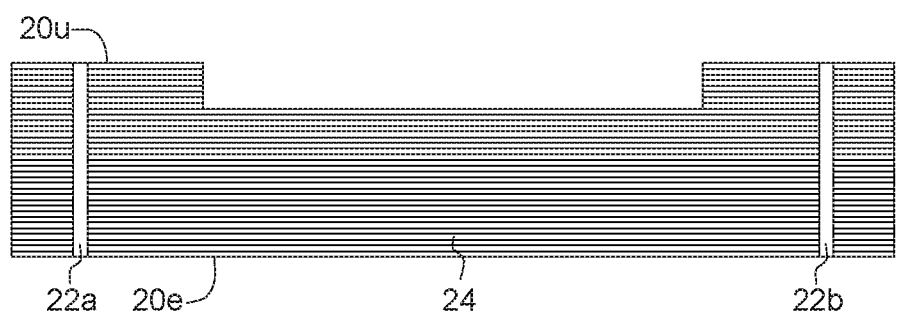

As shown in FIG. 8B, the first conductive via 22a and the second conductive via 22b are formed to pass through the stacked ceramic substrate by way of, for example, drill technique.

Figure 8C:
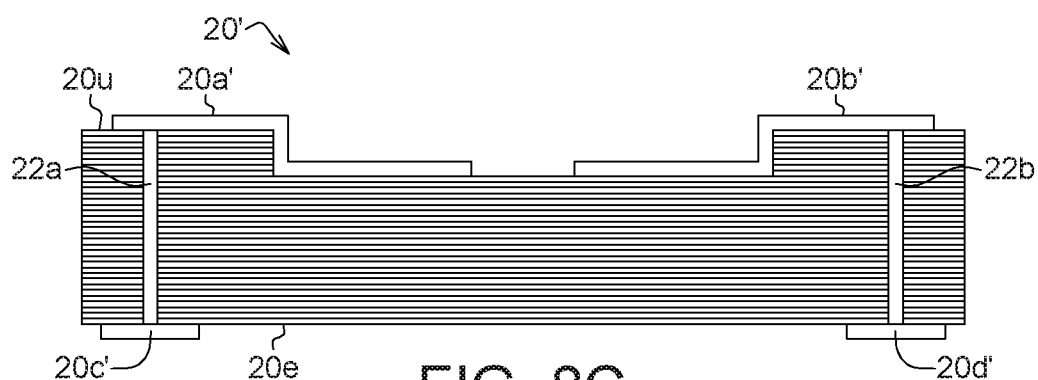

As shown in FIG. 8C, the first conductive pad 20a', the second conductive pad 20b', the third conductive pad 20c' and the fourth conductive pad 20d' are formed to form the carrier substrate 20' by way of, for example, electroplate technique or photolithography technique, wherein the first conductive pad 20a' and the second conductive pad 20b' extend to the recess 21 from the upper surface 20u of the stacked ceramic substrate, the first conductive via 22a connects the first conductive pad 20a' and the third conductive pad 20c', and the second conductive via 22b connects the second conductive pad 20b' and the fourth conductive pad 20d'.

Figure 8D:
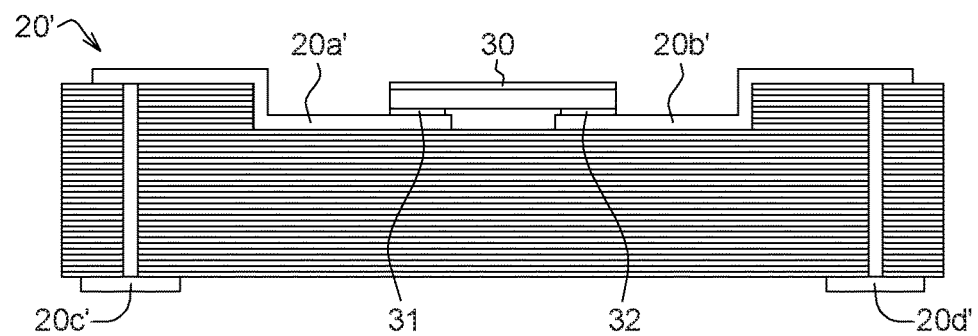

As shown in FIG. 8D, the electrostatic protection component 30 is disposed within the recess 21 by way of, for example, surface mounting technique or eutectic bonding technique. The electrostatic protection component 30 includes the first electrode 31 and the second electrode 32, wherein the first electrode 31 and the second electrode 32 are electrically connected to the first conductive pad 20a' and the second conductive pad 20b' respectively.

Figure 8E:
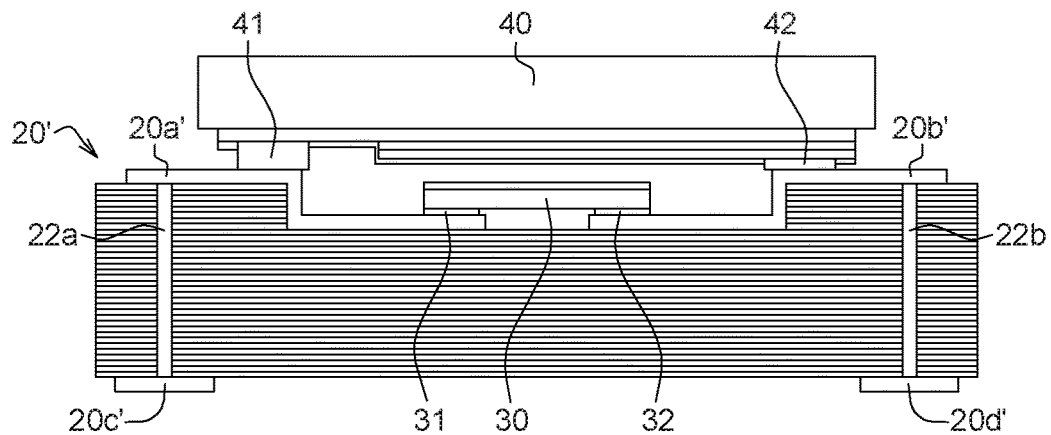

As shown in FIG. 8E, the LED 40 is provided. The LED 40 at least includes the third electrode 41 and the fourth electrode 42.

Then, the LED 40 is disposed on the carrier substrate 20' by way of, for example, surface mounting technique or eutectic bonding technique. The third electrode 41 and the fourth electrode 42 of the LED 40 are electrically connected the first conductive pad 20a' and the second conductive pad 20b' respectively. As a result, the first electrode 31 of the electrostatic protection component 30 and the third electrode 41 of the LED 40 are co-point, and the second electrode 32 of the electrostatic protection component 30 and the fourth electrode 42 of the LED 40 are co-point, and accordingly the electrostatic protection component 30 is connected to the LED 40 in parallel. As a result, the electrostatic protection component 30 may prevent the LED 40 from being damaged by abnormal voltage or electrostatic discharge.

Figure 8F:
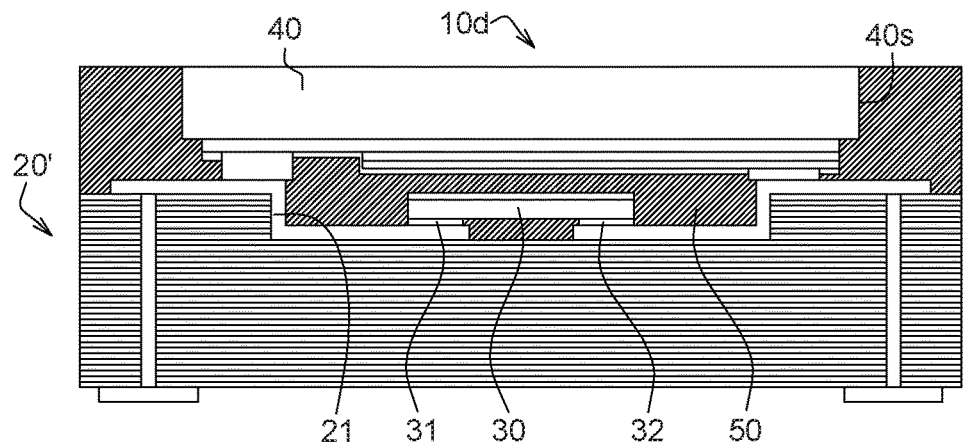

As shown in FIG. 8F, the highly reflective adhesive 50 is formed by way of, for example, packaging technique or dispensing technique to form the light emitting diode package structure 10d of FIG. 5, wherein the recess 21 is filled with the highly reflective adhesive 50 and the highly reflective adhesive 50 covers the lateral surface 40s of the LED 40.

In another embodiment, the highly reflective adhesive 50 may only encapsulate at least a portion of the electrostatic protection component 30, but not encapsulate the lateral surface 40s of the LED 40. In other embodiment, the forming of the highly reflective adhesive 50 of FIG. 8F may be omitted.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light emitting diode package structure, comprising:
a carrier substrate having a recess formed therein and an upper surface surrounding the recess, wherein a first conductive pad and a second conductive pad are disposed on the upper surface and extend into the recess;
an electrostatic protection component disposed in the recess of the carrier substrate and having a first electrode and a second electrode, wherein the first electrode and the second electrode are electrically connected to the first conductive pad and the second conductive pad respectively;
a light-emitting diode (LED) flipped on the upper surface of the carrier substrate and disposed above the electrostatic protection component and having a third electrode and a fourth electrode, wherein the third electrode and the fourth electrode are electrically connected to the first conductive pad and the second conductive pad respectively and a space exists between a bottom surface of the LED and an upper surface of the electrostatic protection component; and
a reflective adhesive layer disposed on the upper surface of the carrier substrate and exposed an upper surface of the LED, wherein the reflective adhesive layer is proximate to a side surface of the LED and a portion of the reflective adhesive layer is filled into the space, and an edge of an upper surface of the reflective adhesive layer is substantially aligned with a neighboring edge of the upper surface of the LED.

2. The light emitting diode package structure according to claim 1, wherein the carrier substrate has a third conductive pad and a fourth conductive pad disposed on a bottom surface of the carrier substrate and electrically connected to the first conductive pad and the second conductive pad through conductive vias, respectively.

3. The light emitting diode package structure according to claim 1, wherein the recess has a depth less than a half of a thickness of the carrier substrate.

4. The light emitting diode package structure according to claim 1, wherein the reflective adhesive layer is filled within the recess for securing the electrostatic protection component.

5. The light emitting diode package structure according to claim 1, wherein the electrostatic protection component is a Zener diode.

6. The light emitting diode package structure according to claim 5, wherein the electrostatic protection component comprises a first reflective layer disposed on the upper surface of the electrostatic protection component.

7. The light emitting diode package structure according to claim 1, wherein the LED comprises a reflective layer disposed on the bottom surface of the LED.

8. The light emitting diode package structure according to claim 1, wherein at least one of the first electrode and the second electrode of the electrostatic protection component is located between the third electrode and the fourth electrode of the LED.

9. A manufacturing method of a light emitting diode package structure, comprising:
providing a carrier substrate having a recess formed therein and an upper surface surrounding the recess, wherein a first conductive pad and a second conductive pad are disposed on the upper surface and extend into the recess;
disposing an electrostatic protection component in the recess of the carrier substrate, wherein the electrostatic protection component has a first electrode and a second electrode;
electrically connecting the first electrode and the second electrode to the first conductive pad and the second conductive pad respectively;
flipping a LED on the upper surface of the carrier substrate and disposing the LED above the carrier substrate, wherein the LED has a third electrode and a fourth electrode;
electrically connecting the third electrode and the fourth electrode to the first conductive pad and the second conductive pad respectively, wherein a space exists between a bottom surface of the LED and an upper surface of the electrostatic protection component; and
disposing a reflective adhesive layer on the upper surface of the carrier substrate, wherein the reflective adhesive layer exposes an upper surface of the LED and is proximate to a side surface of the LED, a portion of the reflective adhesive layer is filled into the space, and an edge of an upper surface of the reflective adhesive layer is substantially aligned with a neighboring edge of the upper surface of the LED.

10. The manufacturing method according to claim 9, further comprising:
disposing a third conductive pad and a fourth conductive pad on a bottom surface of the carrier substrate, wherein the third conductive pad and the fourth conductive pad are electrically connected to the first conductive pad and the second conductive pad through conductive vias, respectively.

11. The manufacturing method according to claim 10, further comprising:
filling a reflective adhesive layer within the recess for securing the electrostatic protection component.

12. The manufacturing method according to claim 10, wherein the step of providing a carrier substrate comprises:
disposing an insulation body between the first conductive pad and the second conductive pad; and
forming the recess between the first conductive pad and the second conductive pad by way of half-etching technique.

13. The manufacturing method according to claim 10, wherein the step of providing the carrier substrate comprises:
providing the first conductive pad having a first sub-recess;
providing the second conductive pad having a second sub-recess, wherein the first sub-recess and the second sub-recess form the recess; and
disposing an insulation body between the first conductive pad and the second conductive pad.

14. The manufacturing method according to claim 10, wherein the step of providing the carrier substrate comprises:
forming a ceramic substrate by way of stacking technique, wherein the ceramic substrate has a recess;
forming a first conductive via and a second conductive via passing through the ceramic substrate;
forming the first conductive pad and the second conductive pad on the upper surface of the ceramic substrate, wherein the first conductive pad and the second conductive pad are electrically connected to the first conductive via and the second conductive via respectively; and
forming a third conductive pad and a fourth conductive pad on a lower surface of the ceramic substrate, wherein the third conductive pad and the fourth conductive pad are electrically connected to the first conductive via and the second conductive via respectively.

15. The manufacturing method according to claim 9, further comprising:
disposing a reflective layer on the bottom surface of the LED.

16. The manufacturing method according to claim 9, further comprising:
disposing a first reflective layer on the upper surface of the electrostatic protection component.

* * * * *